(12) United States Patent
Lee et al.

(10) Patent No.: US 10,355,167 B2
(45) Date of Patent: Jul. 16, 2019

(54) LIGHT EMITTING DEVICE HAVING NITRIDE QUANTUM DOT AND METHOD OF MANUFACTURING THE SAME

(71) Applicants: SAMSUNG ELECTRONICS CO., LTD., Suwon-si (KR); KOREA PHOTONICS TECHNOLOGY INSTITUTE, Gwangju (KR)

(72) Inventors: Jaesoong Lee, Suwon-si (KR); Youngho Song, Gwangju (KR)

(73) Assignees: SAMSUNG ELECTRONICS CO., LTD., Suwon-si (KR); KOREA PHOTONICS TECHNOLOGY INSTITUTE, Gwangju (KR)

( * ) Notice: Subject to any disclaimer, the term of this patent is extended or adjusted under 35 U.S.C. 154(b) by 83 days.

(21) Appl. No.: 15/086,862

(22) Filed: Mar. 31, 2016

(65) Prior Publication Data

US 2017/0148947 A1     May 25, 2017

(30) Foreign Application Priority Data

Nov. 20, 2015   (KR) .................. 10-2015-0163343

(51) Int. Cl.
*H01L 33/00* (2010.01)
*H01L 29/15* (2006.01)
(Continued)

(52) U.S. Cl.
CPC .............. *H01L 33/06* (2013.01); *H01L 33/12* (2013.01); *H01L 33/20* (2013.01); *H01L 33/32* (2013.01);
(Continued)

(58) Field of Classification Search
CPC .......... H01L 33/58; H01L 33/06; H01L 33/18; H01L 33/32; H01L 33/08; H01L 33/20; H01L 2933/0058; H01L 2933/0083
See application file for complete search history.

(56) References Cited

U.S. PATENT DOCUMENTS

| 7,935,388 B2 | 5/2011 | Chen et al. |
| 8,017,415 B2 | 9/2011 | Zimmerman et al. |

(Continued)

FOREIGN PATENT DOCUMENTS

| JP | 2007123731 A | * | 5/2007 |
| KR | 10-2012-0083084 A | | 7/2012 |

OTHER PUBLICATIONS

Yasuhiro Shirasaki, et al; "Emergence of colloidal quantum-dot light-emitting technologies"; Nature Photonics; vol. 7; Jan. 2013; pp. 13-23.

(Continued)

*Primary Examiner* — Mary A Wilczewski
*Assistant Examiner* — Tsz K Chiu
(74) *Attorney, Agent, or Firm* — Sughrue Mion, PLLC

(57) ABSTRACT

Provided are a light emitting device having a nitride quantum dot and a method of manufacturing the same. The light emitting device may include: a substrate; a nitride-based buffer layer arranged on the substrate; a plurality of nanorod layers arranged on the nitride-based buffer layer in a vertical direction and spaced apart from each other; a nitride quantum dot arranged on each of the plurality of nanorod layers; and a top contact layer covering the plurality of nanorod layers and the nitride quantum dots. A pyramid-shaped material layer may be further included between each of the plurality of nanorod layers and each of the nitride quantum dots. One or the plurality of nitride quantum dots may be arranged on each of the nanorod layers.

13 Claims, 13 Drawing Sheets

(51) Int. Cl.
*H01L 33/06* (2010.01)
*H01L 33/12* (2010.01)
*H01L 33/20* (2010.01)
*H01L 33/32* (2010.01)
*H01L 33/62* (2010.01)

(52) U.S. Cl.
CPC ...... *H01L 33/62* (2013.01); *H01L 2933/0033* (2013.01); *H01L 2933/0066* (2013.01)

(56) References Cited

U.S. PATENT DOCUMENTS

| | | | | |
|---|---|---|---|---|
| 8,017,860 | B2* | 9/2011 | Lee | B82Y 10/00 136/252 |
| 8,129,728 | B2* | 3/2012 | Pan | H01L 33/58 257/79 |
| 8,338,853 | B2 | 12/2012 | Kiyama et al. | |
| 8,669,544 | B2 | 3/2014 | Mi et al. | |
| 9,287,444 | B2* | 3/2016 | Lee | H01L 33/06 |
| 9,601,340 | B2* | 3/2017 | Lee | H01L 29/122 |
| 2004/0094772 | A1* | 5/2004 | Hon | H01L 33/22 257/102 |
| 2005/0179052 | A1* | 8/2005 | Yi | B82Y 10/00 257/183 |
| 2005/0194598 | A1* | 9/2005 | Kim | H01L 33/08 257/79 |
| 2006/0208273 | A1* | 9/2006 | Kang | H01L 33/08 257/103 |
| 2007/0285000 | A1* | 12/2007 | Lim | G02F 1/133603 313/501 |
| 2008/0157057 | A1* | 7/2008 | Kim | H01L 33/06 257/13 |
| 2008/0185595 | A1* | 8/2008 | Moon | H01L 33/0016 257/79 |
| 2011/0126891 | A1* | 6/2011 | Goto | B82Y 20/00 136/255 |
| 2015/0021549 | A1 | 1/2015 | Zhang et al. | |
| 2015/0263225 | A1* | 9/2015 | Lee | H01L 33/06 257/13 |
| 2015/0295128 | A1* | 10/2015 | Lee | H01L 29/122 257/14 |

OTHER PUBLICATIONS

Yungting Chen, et al; "Ultraviolet electroluminescence from hybrid inorganic/organic ZnO/GaN/poly(3-hexylthiophene) dual heterojunctions"; Optics Express; vol. 19; No. S3; May 9, 2011; pp. A319-A325.

* cited by examiner

LIGHT EMITTING DEVICE HAVING NITRIDE QUANTUM DOT AND METHOD OF MANUFACTURING THE SAME

CROSS-REFERENCE TO RELATED APPLICATION

This application claims priority from Korean Patent Application No. 10-2015-0163343, filed on Nov. 20, 2015, in the Korean Intellectual Property Office, the disclosure of which is incorporated herein in its entirety by reference.

BACKGROUND

1. Field

Apparatuses and methods consistent with exemplary embodiments relate to a light emitting device using a quantum dot as a light source, and more particularly, to a light emitting device having a nitride quantum dot and a method of manufacturing the same.

2. Description of the Related Art

Early light emitting devices (LEDs) were widely used as simple display devices on an instrument panel. Recently, the LED has received a lot of attention as a full natural color display device having high luminance, high visibility and long life for a large scale electronic display, etc. This has been possible through development of blue and green color high luminance light emitting diodes. Materials for such LEDs that have been the subject of a lot of recent research are III-V group nitride compound semiconductors such as gallium nitride (GaN). The reason is that the III-V group nitride compound semiconductors have a wide bandgap and thus, can obtain light with almost all wavelength ranges from visible rays to ultraviolet rays depending on nitride compositions.

Pixels have become miniaturized to pursue image quality enhancement and flexibility so that the LED is used in a mobile display or a flexible display. In addition, an efficiency enhancement of each pixel has been emphasized to secure a sufficient amount of light even in a small pixel. Research on a light source with a small size and on a quantum dot (QD) have been actively performed because the QD has a higher efficiency than a quantum well (QW) in a small light emitting device.

Formation of a self-assembled QD is a method of manufacturing a zero-dimensional electronic apparatus that has received a lot of attention in a semiconductor research area. A method mainly used in the QD formation is the Stranski-Kranstanov (S-K) growth method. Various limiting factors have been observed in manufacturing a nitride QD by using the S-K growth method. For example, the S-K growth method uses an aluminum nitride (AlN) template substrate which is either free standing with significant compression or totally relaxed, but it is difficult to use the AlN in the LED due to an insulation characteristic thereof.

SUMMARY

Provided are a light emitting device (LED) having a nitride quantum dot for increasing photo extraction efficiency and emitting light with a broad wavelength range, and a method of manufacturing the same.

Additional aspects will be set forth in part in the description which follows and, in part, will be apparent from the description, or may be learned by practice of the presented exemplary embodiments.

According to an aspect of an exemplary embodiment, a light emitting device may include a substrate; a nitride-based buffer layer arranged on the substrate; a plurality of nanorod layers arranged on the nitride-based buffer layer in a vertical direction, the plurality of nanorod layers being spaced apart from each other; a nitride quantum dot (QD) arranged on the plurality of nanorod layers; and a top contact layer covering the plurality of nanorod layers and the nitride QD.

The nanorod layer may be a first conductivity type and the top contact layer may be a second conductivity type.

The LED may include a first electrode arranged on the nitride-based buffer layer and connected to the first conductive type nanorod layer; and a second electrode arranged on the top contact layer and connected to the second conductive type top contact layer.

The nitride-based buffer layer may include gallium nitride (GaN).

The LED may include a transparent insulating layer filled in between the plurality of nanorod layers.

The nanorod layer may include zinc oxide (ZnO) having a lattice constant similar to that of the nitride-based buffer layer.

The nitride QD may include indium gallium nitride (InGaN).

Each of the nitride quantum dots may emit at least one of blue color, green color and red color by adjusting content of the indium and the gallium in the nitride quantum dot.

The LED may further include a pyramid-shaped material layer arranged between the plurality of nanorod layers and the nitride QD.

The pyramid-shaped material layer may include a metal included in the nitride QD.

A plurality of nitride quantum dots may be arranged on one of the nanorod layers.

According to an aspect of another exemplary embodiment, a light emitting device may include a substrate; a first semiconductor layer arranged on the substrate; an activating layer arranged on the first semiconductor layer; a second semiconductor layer arranged on the activating layer; a plurality of nanorod layers arranged on the second semiconductor layer in a vertical direction, the plurality of nanorod layers being spaced apart from each other; a nitride QD arranged on the plurality of nanorod layers; and a top contact layer arranged on the plurality of nanorod layers and covering the nitride QD.

According to an aspect of an exemplary embodiment, a method of manufacturing a light emitting device, the method may include forming a nitride-based buffer layer on a substrate; forming a nanorod layer on the nitride-based buffer layer; forming a metal thin film on the nanorod layer; modifying the metal thin film into a metal quantum dot; nitrating the metal quantum dot; and forming a top contact layer covering the nitrated metal quantum dot and the nanorod layer.

The forming the nanorod layer may include forming a mask layer on the nitride-based buffer layer; forming a plurality of through-holes on the mask layer to expose the nitride-based buffer layer; and filling a material layer composing the nanorod layer in each of the plurality of through-holes.

The method of manufacturing a light emitting device may include forming a first electrode on the nitride-based buffer layer; and forming a second electrode on the top contact layer.

The modifying the metal thin film into a metal quantum dot may include annealing the metal thin film.

The nitrating the metal quantum dot may include controlling an ammonia forming condition for the metal quantum dot.

According to an aspect of another exemplary embodiment, a method of manufacturing a light emitting device, the method may include forming a nitride-based buffer layer on a substrate; forming a nanorod layer on the nitride-based buffer layer; forming a pyramid-shaped material layer on the nanorod layer; forming a nitride quantum dot at a tip portion of the pyramid-shaped material layer; and forming a top contact layer covering the nitride quantum dot and the pyramid-shaped material layer.

The forming the pyramid-shaped material layer may include growing the pyramid-shaped material layer on the nanorod layer by applying a pyramid forming condition.

The forming the nitride quantum dot at the tip portion of the pyramid-shaped material layer may include supplying both a metal included in the pyramid-shaped material layer and an ammonia gas together.

According to an aspect of an exemplary embodiment, a light emitting device is provided. The light emitting device includes: a substrate; a nitride-based buffer layer arranged on the substrate; a nanorod layer arranged on the nitride-based buffer layer in a vertical direction; a nitride quantum dot arranged on the nanorod layer; and a top contact layer covering the nanorod layer and the nitride quantum dot.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
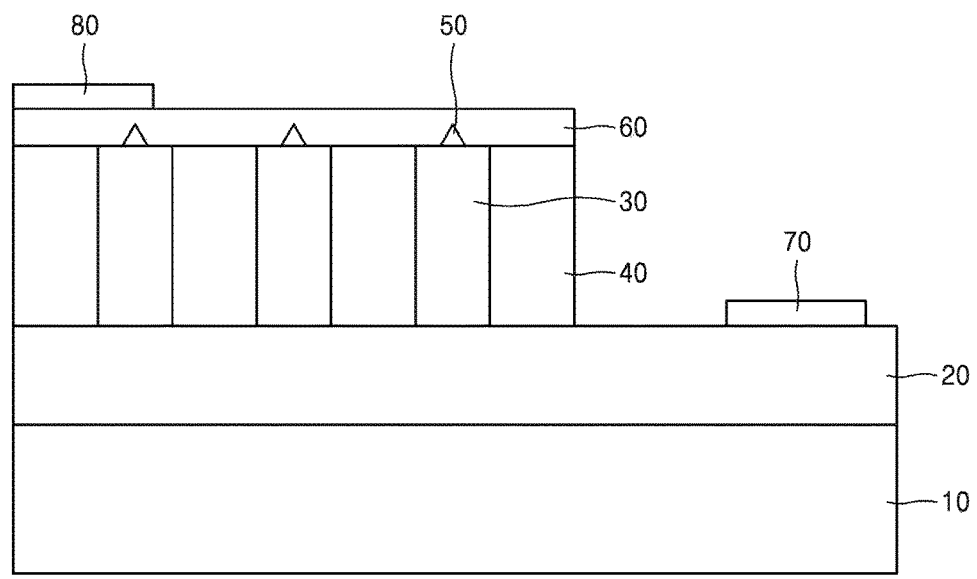
FIG. 1 is a cross-sectional view of a light emitting device (LED) having nitride quantum dots according to an aspect of an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects. In the description of the inventive concept, certain detailed explanations of the related art are omitted when it is deemed that they may unnecessarily obscure the essence of the inventive concept. As used herein, the term "and/or" includes any and all combinations of one or more of the associated listed items.

Throughout the specification, when a portion is "connected" to another portion, "connected" refers to a case of "directly connected" as well as a case of "electrically connected" with other device therebetween. Also, throughout the specification, when a portion "includes" an element, another element may be further included, rather than excluding the existence of the other element, unless otherwise described.

Throughout the specification, the singular forms "a," "an" and "the" are intended to include the plural forms as well, unless the context clearly indicates otherwise.

FIG. 1 is a cross-sectional view of a light emitting device (LED) having nitride quantum dots according to an aspect of an exemplary embodiment.

Referring to FIG. 1, the LED may include a nitride-based buffer layer 20 on a sapphire substrate 10, a plurality of nanorod layers 30 arranged on the nitride-based buffer layer 20 in a vertical direction and spaced apart from each other, a transparent insulating layer 40 filled in between the plurality of nanorod layers 30, nitride quantum dots 50 respectively arranged on the plurality of nanorod layers 30, a top contact layer 60 covering the plurality of nanorod layers 30, the nitride quantum dots 50 and the transparent insulating layer 40, a first electrode 70 arranged on the nitride buffer layer 20, and a second electrode 80 arranged on the top contact layer 60. The nitride-based buffer layer 20 and the nanorod layers 30 may be a first conductivity type and the top contact layer 60 may be a second conductivity type. The first conductivity type and the second conductivity type may respectively denote an n-type and a p-type, or a p-type or an n-type.

The nitride-based buffer layer 20 arranged on the substrate 10 may buffer mismatches of a lattice constant of the substrate 10 and the nanorod layers 30, and may commonly apply a voltage to the plurality of first conductivity type nanorod layers 30 via the first electrode 70. The nitride-based buffer layer 20 may be a GaN substrate; however, it is not limited thereto. The nitride-based buffer layer 20 and the nanorod layers 30 may include materials having similar lattice constants and similar refractive indices. By using similar materials, the nitride-based buffer layer 20 may minimize the lattice constant mismatches between the substrate 10 and the nanorod layers 30 and reduce the Fresnel reflection, and thus, the photo extraction efficiency may increase.

The plurality of nanorod layers 30 may be arranged on the nitride-based buffer layer 20 in a vertical direction and spaced apart from each other. Each of nanorod layers 30 may have a uniform diameter and a uniform height. The height of each of the nanorod layers 30 may be greater than the diameter thereof. The nanorod layers 30 may include zinc oxide (ZnO) having a lattice constant similar to that of the nitride-based buffer layer 20.

The transparent insulating layer 40 may be filled in between the plurality of nanorod layers 30, insulate each of nanorod layers 30, and protect the nanorod layers 30 from an impact which may be applied to the nanorod layers 30. A material for the transparent insulating layer 40 may densely fill the space between the nanorod layers 30, endure the heat during a subsequent annealing process, and include transparent spin on glass (SOG), $SiO_2$ or an epoxy resin, but is not particularly be limited thereto.

The nitride quantum dot 50 may be arranged on a portion of a top surface of each of the nanorod layers 30. The nitride quantum dot 50 may include indium gallium nitride (InGaN); however, it is not limited thereto.

The top contact layer 60 may cover the plurality of nanorod layers 30, the nitride quantum dots 50 and the transparent insulating layer 40. The top contact layer 60 may provide a stable contact which may simultaneously connect the plurality of nitride quantum dots 50. The top contact layer 60 may include a transparent conductive material not to interfere with emission of the nitride quantum dots 50. The top contact layer 60 may include a material, for example, AlGaN or InGaN; however, it is not limited thereto. A height of a top surface of the top contact layer 60 may be greater than or equal to that of the tip of each of the nitride quantum dots 50. The top contact layer 60 may be a second conductivity type.

The first electrode 70 may be connected to the first conductivity type nanorod layers 30 and arranged on the nitride-based buffer layer 20. The first electrode 70 may be a terminal to apply a voltage to the first conductivity type nanorod layers 30 via the nitride-based buffer layer 20 and may include a Ti/Al layer; however, it is not limited thereto.

The second electrode 80 may be connected to the second conductivity type top contact layer 60 and arranged on the top contact layer 60. The second electrode 80 may be a terminal to apply a voltage to the second conductivity type top contact layer 60 and may include a Ni/Au layer; however, it is not limited thereto.

When a direct-current voltage is applied between the first and second electrodes 70 and 80 of the light emitting device configured as above according to one or more exemplary embodiments, light with high luminance may be emitted from the nitride quantum dots 50 each of which may be denoted as a nano light emitting device.

Meanwhile, a wavelength of the light emitted from the light emitting device according to one or more exemplary embodiments may be variously controlled by controlling the content of indium (In) of the nitride quantum dots 50 including InGaN, and thus, white light may also be obtained. For example, emitted light may be obtained which may cover from the ultraviolet region to all visible light regions including the blue color, green color, red color, etc., by using a phenomenon that the wavelength of the emitted light may be longer as the content of In in the nitride quantum dot 50 increases. Thus, the bandgap may become smaller. In addition, when the plurality of nitride quantum dots 50 are divided into several groups, the content of In of each group is differently controlled, and a blue color emitting group, a green color emitting group and a red color emitting group are prepared, to thereby obtain the white light by combining all groups.

Figure 2:
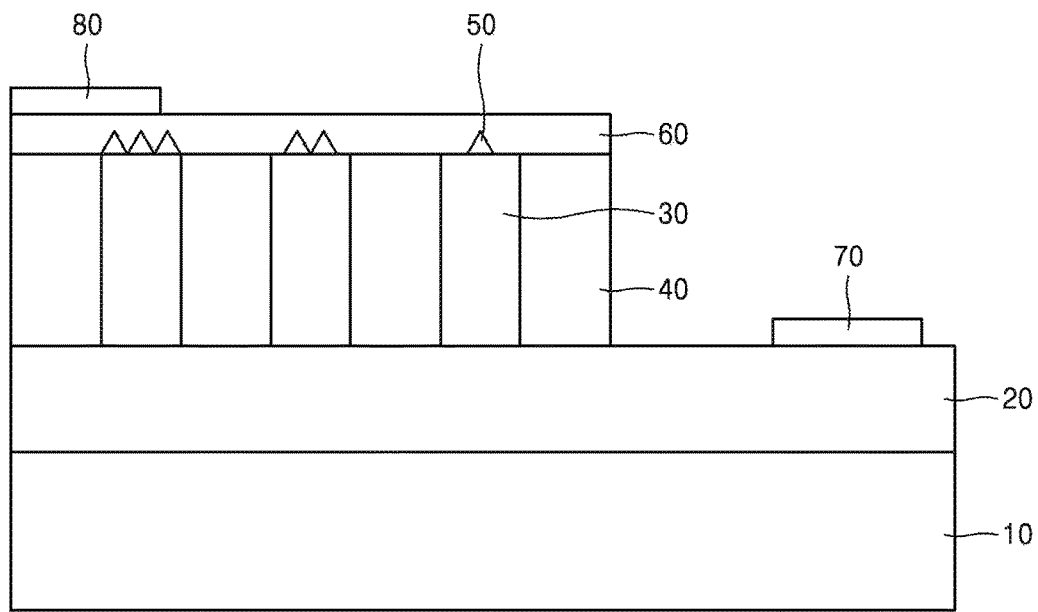
FIG. 2 is a cross-sectional view of an LED, having nitride quantum dots, with different numbers of nitride quantum dots respectively arranged on nanorod layers according to an aspect of an exemplary embodiment.

FIG. 2 is a cross-sectional view of an LED, having nitride quantum dots 50, with different numbers of nitride quantum dots 50 respectively arranged on nanorod layers according to an aspect of an exemplary embodiment.

Referring to FIG. 2, three nitride quantum dots 50 may be arranged on the nanorod layer 30 located on the left of the drawing, two nitride quantum dots 50 on the nanorod layer 30 located in the middle thereof, and one nitride quantum dot 50 on the nanorod layer 30 on the right thereof. In FIGS. 1 through 4, the number of the nanorod layers 30 is limited; however, it is for the sake of illustration and description only and not for limiting the number of the nanorod layer 30. Accordingly, more nanorod layers 30 may be arranged on the nitride-based buffer layer 20 than illustrated in the drawings.

When three or more nitride quantum dots 50 are arranged on a single nanorod layer 30, the white light may be realized on the single nanorod layer 30. In addition, an intensity of the emitted light may be controlled by arranging a plurality of nitride quantum dots 50 emitting an identical color on one nanorod layer 30. The number of the nitride quantum dots 50 arranged on one nanorod layer 30 may be variously changed depending on a device to be applied.

Figure 3:
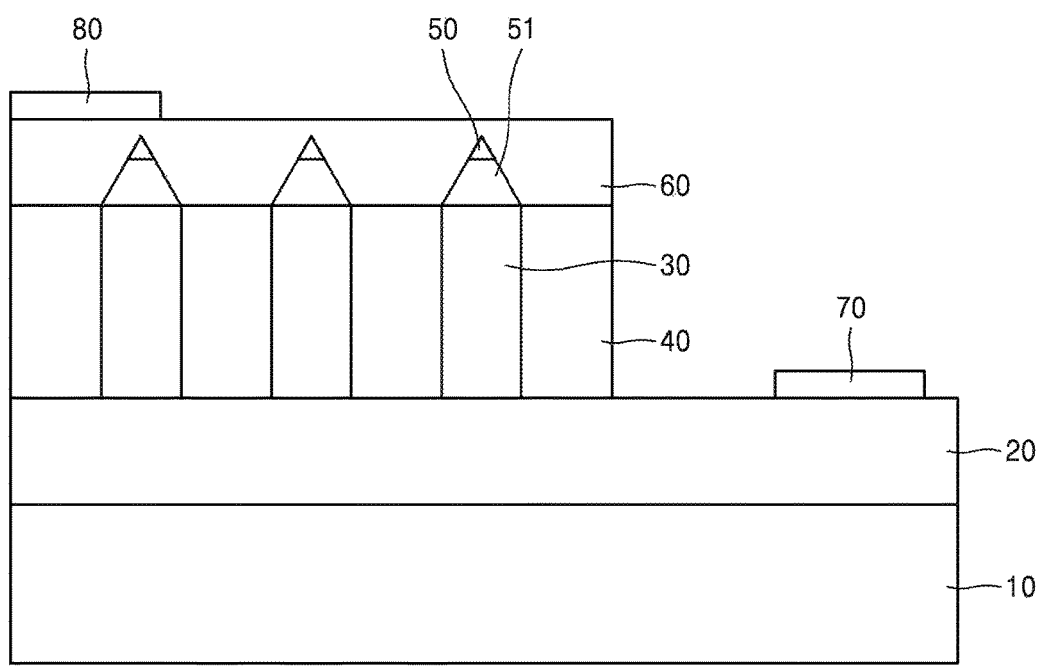
FIG. 3 is a cross-sectional view of an LED having nitride quantum dots according to an aspect of another exemplary embodiment.

FIG. 3 is a cross-sectional view of an LED having nitride quantum dots 50 according to an aspect of another exemplary embodiment.

Referring to FIG. 3, the LED illustrated in FIG. 3 may further include a pyramid-shaped material layer 51 arranged between the nanorod layer 30 and the nitride quantum dot 50 of the LED illustrated in FIG. 1. The pyramid-shaped material layer 51 may include the metal included in the nitride quantum dot 50, and include Ga or In. The nitride quantum dot 50 may be nitride at the tip portion of the pyramid-shaped material layer 51.

Figure 4:
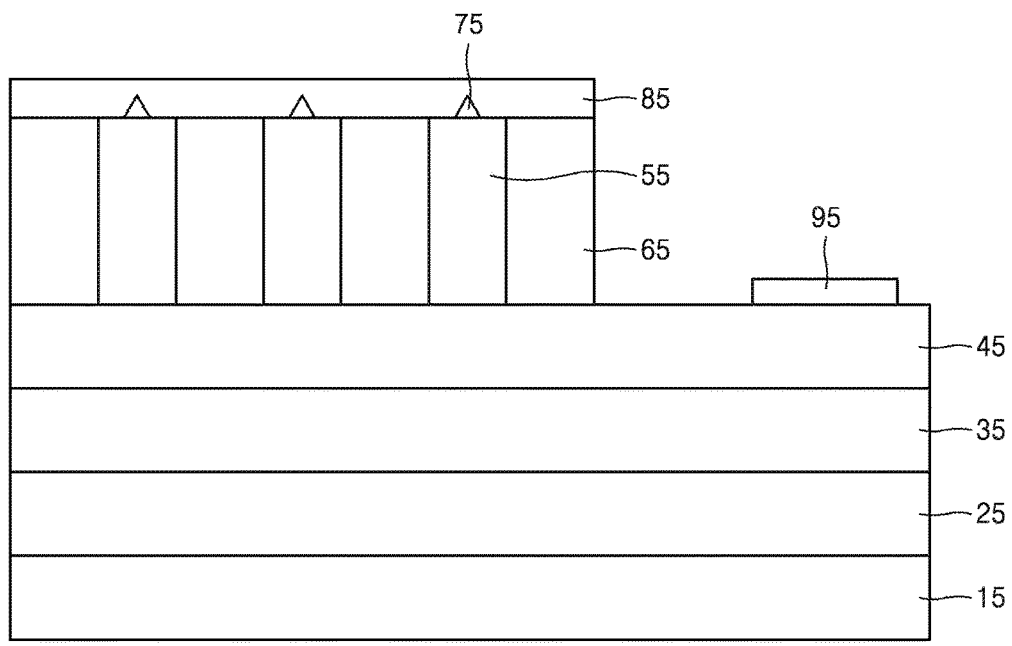
FIG. 4 is a cross-sectional view of an LED having nitride quantum dots according to an aspect of another exemplary embodiment.

FIG. 4 is a cross-sectional view of an LED having nitride quantum dots according to an aspect of another exemplary embodiment.

Referring to FIG. 4, the LED, according to one or more exemplary embodiments, may include a first semiconductor layer 25, an activating layer 35 and a second semiconductor layer 45 sequentially laminated on a substrate 15, a plurality of nanorod layers 55 arranged on the second semiconductor layer 45 in a vertical direction and spaced apart from each other, a transparent insulating layer 65 filling in the space between the plurality of nanorod layers 55, nitride quantum dots 75 respectively arranged on the plurality of nanorod layers 55, a top contact layer 85 covering the plurality of nanorod layers 55, the nitride quantum dots 75 and the transparent insulating layer 65, and an electrode 95 arranged on the second semiconductor layer 45.

The first semiconductor layer 25 may be a first conductivity type compound semiconductor layer, and the second semiconductor layer 45 may be a second conductivity type compound semiconductor layer. The first conductivity type and the second conductivity type may respectively denote the n-type and the p-type, or both may denote a p-type or an n-type. An n-type compound semiconductor layer may be, for example, an n-GaN layer. In addition, a p-type compound semiconductor layer may be, for example, a p-GaN layer.

The activating layer 35 is a region where light is generated by a combination of electrons and holes, and may be, for example, a multiple quantum well layer. Light generated in the activating layer 35 may be emitted via the nanorod layers 55 and the nitride quantum dots 75.

FIGS. 5A through 5I are cross-sectional views for explaining a method of manufacturing an LED having nitride quantum dots according to an aspect of an exemplary embodiment.

Figure 5A:
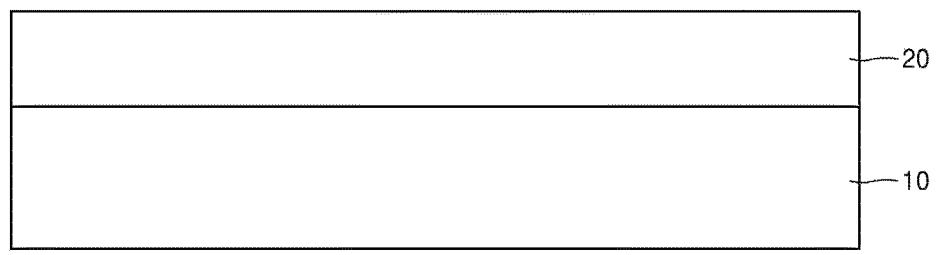
FIGS. 5A through 5I are cross-sectional views for explaining a method of manufacturing an LED having nitride quantum dots according to an aspect of an exemplary embodiment.

Referring to FIG. 5A, the substrate 10 made of a sapphire wafer may be put into a reactor (not illustrated) and the nitride-based buffer layer 20 may be formed on the substrate 10. An n-type nitride-based buffer layer 20 may be formed by doping Si onto the nitride-based buffer layer 20. In addition, the n-type nitride-based buffer layer 20 may be formed by using a property that grown GaN may basically have an n-type characteristic due to nitrogen vacancy or oxygen impurities, even without doping.

Figure 5B:
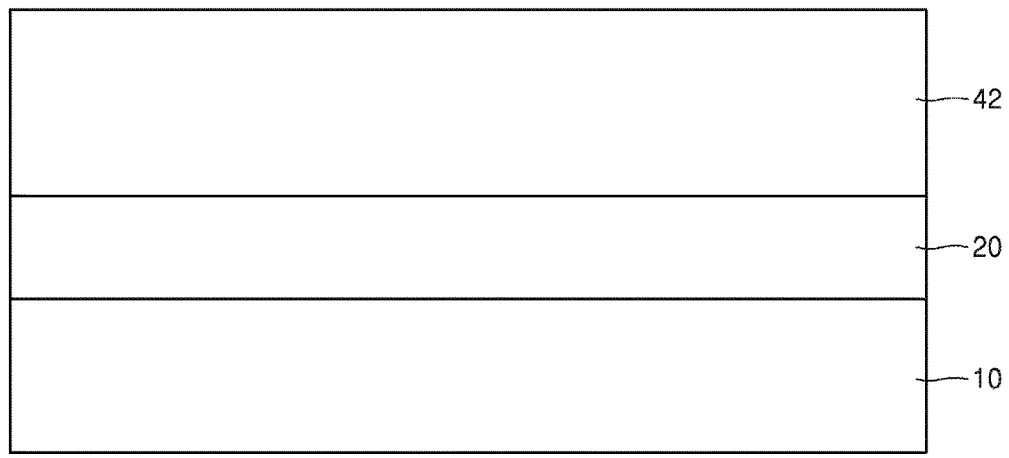

Referring to FIG. 5B, a mask layer 42 may be formed on the nitride-based buffer layer 20. The mask layer 42 may be an insulating layer or a photosensitive layer. The mask layer 42 may be formed to limit a growth range of each of the nanorod layers 30 on the nitride-based buffer layer 20.

Figure 5C:
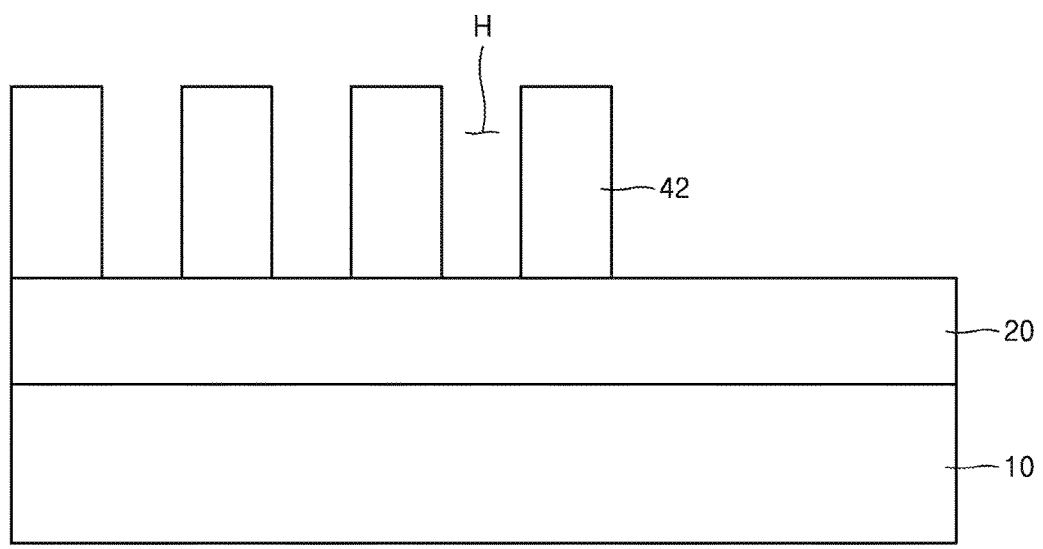

Referring to FIG. 5C, a plurality of through-holes H may be formed on the mask layer 42. The top surface of the nitride-based buffer layer 20 may be exposed through the through-holes H. The diameter of each of the nanorod layers 30 to be formed in a subsequent process may be determined depending on the diameter of each of the through-holes H, and the quantum dots respectively formed on the nanorod layers 30 may be affected by the diameter of each of the nanorod layers 30, and thus, the through-holes may be formed in consideration of such points.

Figure 5D:
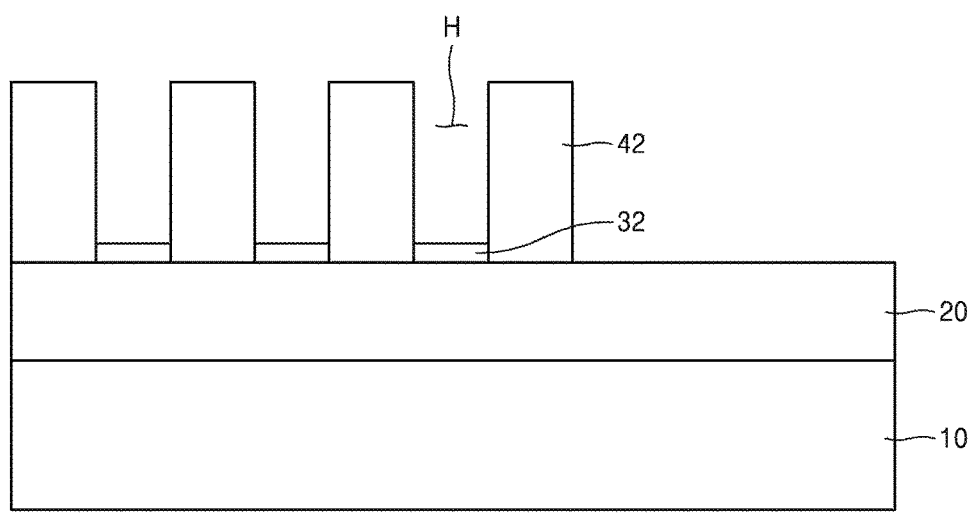

Referring to FIG. 5D, a seed layer 32 may be formed on the surface of the nitride-based buffer layer 20 which may be exposed through the through-holes H, after the through-holes H have been formed. The seed layer 32 may be, for example, an AlGaInN layer.

Figure 5E:
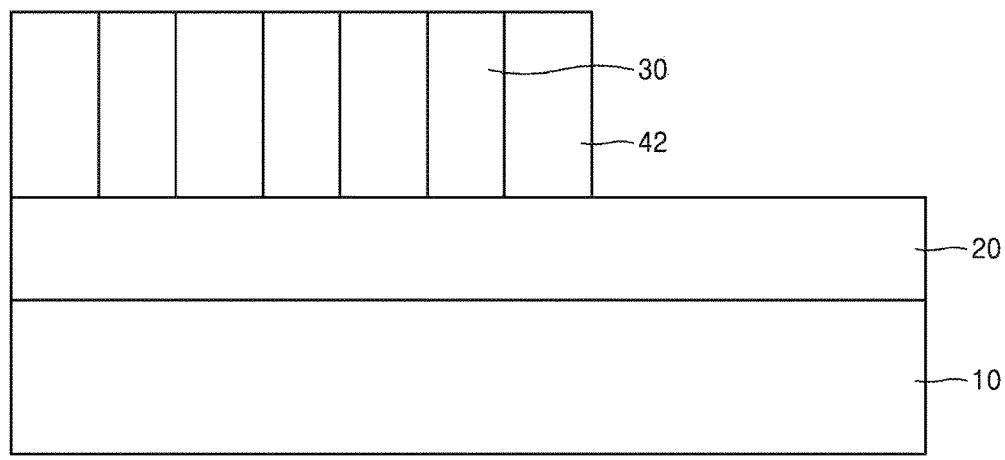

Referring to FIG. 5E, the nanorod layers 30 may be allowed to grow in the through-holes H with the seed layer 32 as a nucleus. Growth of the nanorod layers 30 may continue until the through-holes H are filled with the nanorod layers 30. When each of the nanorod layers 30 grows higher than the top surface of the mask layer 42, a corresponding portion may be removed by using a flattening process such as an etchback and a chemical mechanical polishing (CMP). The growth of each of the nanorod layers 30 may be performed by using a conventional epitaxy method. The nanorod layers 30 may be formed of a material which may have the lattice constant similar to that of the nitride-based buffer layer 20 and thus, may minimize mismatches of the lattice constant with the nitride-based buffer layer 20. For example, each of the nanorod layers 30 may be formed of a ZnO nanorod layer. Since an area excluding the through-holes H on the nitride-based buffer layer 20 may be covered with the mask layer 42, the nanorod layers may not be formed in the area excluding the through-holes H in a growth process of the nanorod layers 30.

Figure 5F:
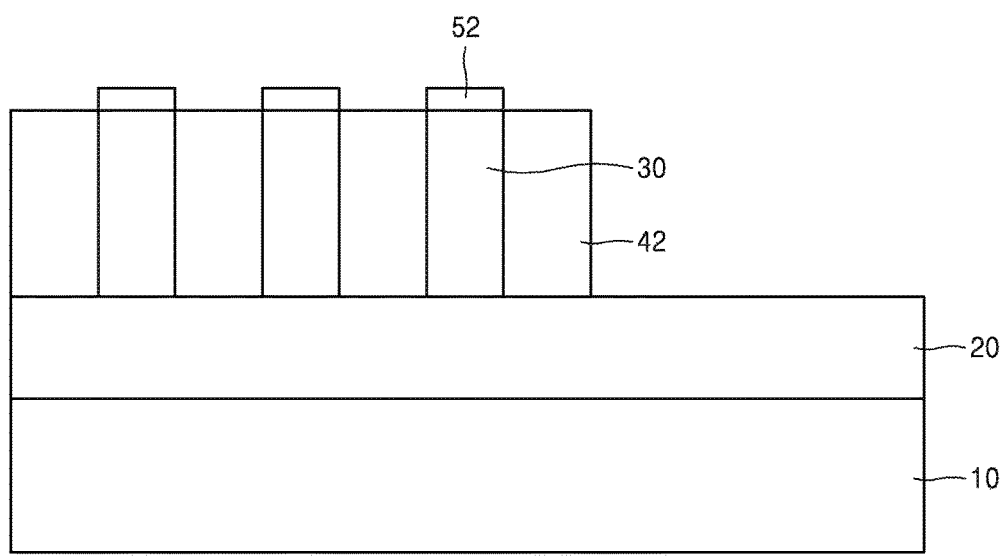

Referring to FIG. 5F, a quantum dot may be formed on an exposed surface of each of the nanorod layers 30, that is, on the top surface of each of the nanorod layers 30, after each of the nanorod layers 30 has been formed, and the quantum dot may be formed by using a metal droplet method. In detail, first, a metal thin film 52 may be formed on each of the nanorod layers 30. The metal thin film 52 may be formed at a certain thickness and for example, at a thickness of about 1 nm to about 100 nm. Since a circumferential surface of each of the nanorod layers 30 may be covered with the mask layer 42, the metal thin film 52 may be selectively formed on each of the nanorod layers 30 only. The metal thin film 52 may include the metal included in the quantum dot. The metal thin film 52 may be a one component system thin film or a two component system thin film. When the quantum dot is InGaN and the metal thin film 52 is a one component system, the metal thin film 52 may be an In thin film or a Ga thin film. When the metal thin film 52 is a two component system, the metal thin film 52 may be, for example, an InGa thin film. The metal thin film 52 may be annealed at a certain temperature after the metal thin film 52 has been formed. An annealing temperature range may be, for example, about 500° C. to about 1200° C. The metal thin film 52 may have a bundling characteristic in accordance with the annealing temperature. Each of the metal quantum dots may be formed at a desired location with a desired size by using such bundling characteristic of the metal thin film 52 and controlling properly the annealing temperature. As a result, one metal quantum dot may be formed on each of the nanorod layers 30 by controlling growth conditions of the nanorod layers 30 and the annealing temperature of the metal thin film 52, and finally, one nitride quantum dot 50 may be formed on each of the nanorod layers 30 via a subsequent nitriding process. Thus, a single photon source may be formed. In addition, a plurality of quantum dots 50 also may be formed on one nanorod layer 30.

Figure 5G:
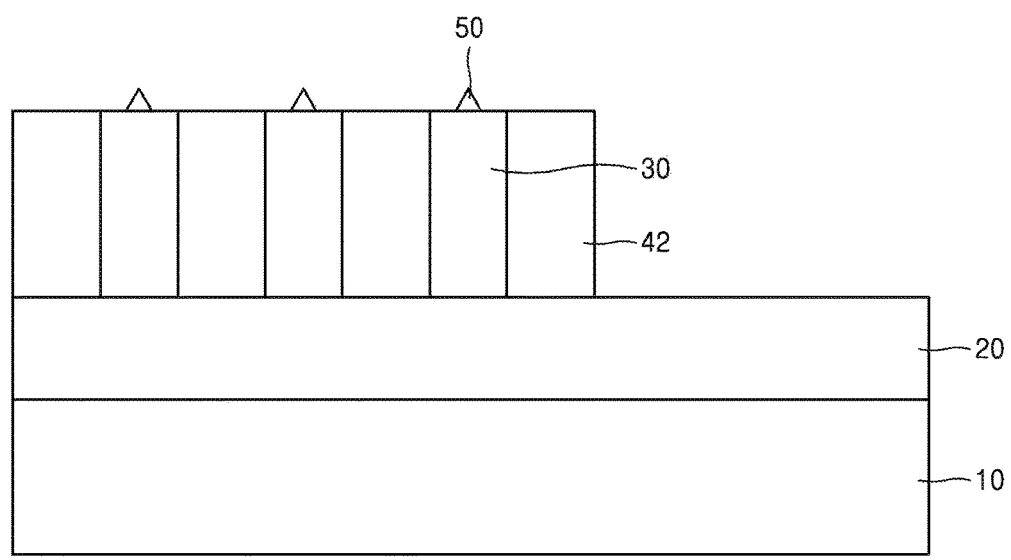
Figure 5H:
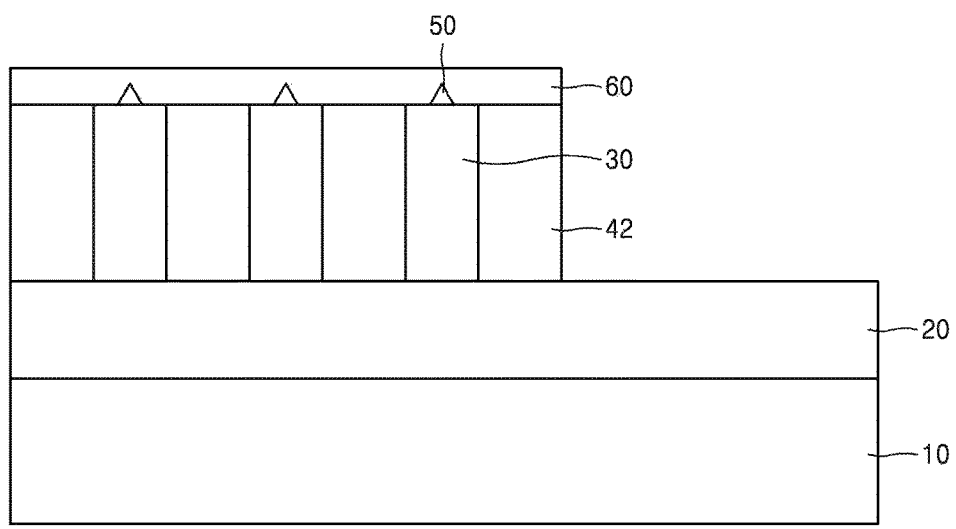

The metal quantum dots may be nitrided after the metal quantum dots have been formed by using the metal droplet method. As a result, as illustrated in FIG. 5G, the nitride quantum dots 50 may be formed on the nanorod layers 30, respectively. A shape, a size, a density, etc. of each of the nitride quantum dots 50 finally formed may be controlled depending on nitration conditions. Nitration conditions may be ammonia formation conditions (pressure, temperature, concentration, annealing time, pulse condition, etc.). In addition, various controlling may be performed by controlling the content of In of the nitride quantum dots 50, and thus, the white light may be obtained also. For example, emitted light may be obtained which may cover from the ultraviolet region to all visible light regions including the blue color, green color, red color, etc., by using a phenomenon that the wavelength of the emitted light may be longer as the content of In of the nitride quantum dots 50 may increase and thus the bandgap may become smaller. In addition, when the plurality of nitride quantum dots 50 are divided into several groups, the content of In of each group is differently controlled, and a blue color emitting group, a green color emitting group and a red color emitting group are prepared, to thereby obtain the white light by combining all groups Referring to FIG. 5H, the top contact layer 60 covering the plurality of nanorod layers 30, the nitride quantum dots 50 and the mask layer 42 may be formed, after the nitride quantum dots 50 have been formed. The top contact layer 60 may include, for example, AlGaN or InGaN. The top contact layer 60 may be formed with an overgrowth condition in a lateral direction or with a growth condition in which a growth speed in a horizontal direction is faster than that in the vertical direction. Then, the top contact layer 60 covering the top surfaces of nanorod layers 30, the nitride quantum dots 50 and the surface of the mask layer 42 may be formed. The top surface of the top contact layer 60 may be higher than or equal to the tip of each of the nitride quantum dots 50.

Figure 5I:
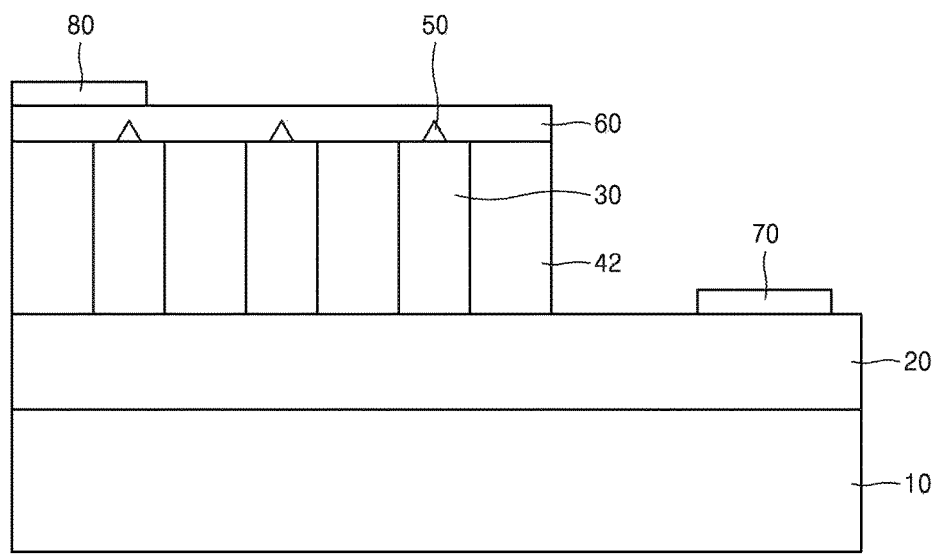

Referring to FIG. 5I, the first electrode 70 may be formed on a portion, exposed by etching of the mask layer 42, of the nitride-based buffer layer 20 and the second electrode 80 may be formed on the top contact layer 60. The first electrode 70 may be a terminal to apply a voltage to the first conductivity type nanorod layers 30 via the nitride-based buffer layer 20 and may include a Ti/Al layer; however, it is not limited thereto. The second electrode 80 may be a terminal to apply a voltage to the second conductivity type top contact layer 60 and may include a Ni/Au layer; however, it is not limited thereto.

On one hand, the pyramid-shaped material layer 51 may be allowed to grow on each of the nanorod layers 30 as illustrated in FIG. 3, instead of forming the metal thin film 52 on each of the nanorod layers 30 as illustrated in FIG. 5F. The pyramid-shaped material layer 51 may include the metal included in each of the nitride quantum dots 50, and may include Ga or In. When Ga or In grows on the nanorod layers 30, the pyramid-shaped material layer 51 may be formed by applying the growth conditions for a pyramid-shape. When the tip portion of the pyramid-shaped material layer 51 is formed, the ammonia gas may be supplied together with Ga or In. Then, the tip portion of the pyramid-shaped material layer 51 may be formed into the nitride quantum dot 50 including InGaN.

On the other hand, the plurality of nitride quantum dots may be formed on one nanorod layer 30 by controlling the annealing temperature in the metal droplet method.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A light emitting device comprising:
a substrate;
a nitride-based buffer layer arranged on the substrate;
a plurality of nanorod layers arranged on the nitride-based buffer layer in a vertical direction, the plurality of nanorod layers being spaced apart from each other, each of the nanorod layers is a first conductive type;
a nitride quantum dot arranged on each of the plurality of nanorod layers;
a top contact layer covering the plurality of nanorod layers and the nitride quantum dots, the top contact layer is a second conductive type;
a first electrode arranged on the nitride-based buffer layer and connected to the first conductive type nanorod layers; and
a second electrode arranged on the top contact layer and connected to the second conductive type top contact layer,
wherein the nitride quantum dots emit light when a direct-current voltage is applied between the first electrode and the second electrode.

2. The light emitting device of claim 1, wherein the nitride-based buffer layer comprises gallium nitride (GaN).

3. The light emitting device of claim 1, further comprising a transparent insulating layer in between the plurality of nanorod layers.

4. The light emitting device of claim 1, wherein each of the nanorod layers comprises zinc oxide (ZnO) having a lattice constant similar to that of the nitride-based buffer layer.

5. The light emitting device of claim 1, wherein each of the nitride quantum dots comprises indium gallium nitride (InGaN).

6. The light emitting device of claim 5, wherein each of the nitride quantum dots emits at least one of blue color, green color and red color light by adjusting the content of indium and gallium in the nitride quantum dots.

7. The light emitting device of claim 1, further comprising a pyramid-shaped material layer arranged between each of the plurality of nanorod layers and each of the nitride quantum dots.

8. The light emitting device of claim 7, wherein the pyramid-shaped material layer comprises a metal included in the nitride quantum dots.

9. The light emitting device of claim 1, wherein a plurality of nitride quantum dots are arranged on one of the nanorod layers.

10. A light emitting device comprising:
a substrate;
a first semiconductor layer arranged on the substrate;
an activating layer arranged on the first semiconductor layer;
a second semiconductor layer arranged on the activating layer;
a plurality of nanorod layers arranged on the second semiconductor layer in a vertical direction, the plurality of nanorod layers being spaced apart from each other;
a nitride quantum dot arranged on each of the plurality of nanorod layers; and
a top contact layer arranged on the plurality of nanorod layers and covering the nitride quantum dots
wherein the activating layer is a region where light is generated, and the light is emitted via the nanorod layers and the quantum dots.

11. A light emitting device comprising:
a substrate;
a nitride-based buffer layer arranged on the substrate;
a nanorod layer arranged on the nitride-based buffer layer in a vertical direction, each of the nanorod layers is a first conductive type;
a nitride quantum dot arranged on the nanorod layer;
a top contact layer covering the nanorod layer and the nitride quantum dot, the top contact layer is a second conductive type;
a first electrode arranged on the nitride-based buffer layer and connected to the first conductive type nanorod layers; and
a second electrode arranged on the top contact layer and connected to the second conductive type top contact layer,
wherein the nitride quantum dot emits light when a direct-current voltage is applied between the first electrode and the second electrode.

12. The light emitting device of claim 11, wherein the nitride-based buffer layer comprises gallium nitride (GaN).

13. The light emitting device of claim 11, wherein the nanorod layer comprises zinc oxide (ZnO) having a lattice constant similar to that of the nitride-based buffer layer.

* * * * *